(12) United States Patent
Kanta et al.

(10) Patent No.: US 11,437,205 B2
(45) Date of Patent: Sep. 6, 2022

(54) METHOD AND DEVICE FOR MONITORING OPERATION OF A SWITCHING DEVICE FOR CONTROLLED SWITCHING APPLICATIONS

(71) Applicant: Hitachi Energy Switzerland AG, Baden (CH)

(72) Inventors: Soumya Kanta, Bangalore (IN); Urmil Parikh, Vadodara (IN); Michael Stanek, Gebenstorf (CH)

(73) Assignee: Hitachi Energy Switzerland AG, Baden (CH)

( * ) Notice: Subject to any disclaimer, the term of this patent is extended or adjusted under 35 U.S.C. 154(b) by 0 days.

(21) Appl. No.: 17/418,046

(22) PCT Filed: Dec. 23, 2019

(86) PCT No.: PCT/IB2019/061266
§ 371 (c)(1),
(2) Date: Jun. 24, 2021

(87) PCT Pub. No.: WO2020/136545
PCT Pub. Date: Jul. 2, 2020

(65) Prior Publication Data
US 2022/0102087 A1    Mar. 31, 2022

(30) Foreign Application Priority Data

Dec. 27, 2018 (IN) .............................. 201841049259

(51) Int. Cl.
*H01H 9/56* (2006.01)
*H01H 33/59* (2006.01)
(Continued)

(52) U.S. Cl.
CPC ............. *H01H 9/563* (2013.01); *G01R 15/14* (2013.01); *G01R 19/16538* (2013.01);
(Continued)

(58) Field of Classification Search
CPC ................... G01R 15/14; G01R 15/142; G01R 19/16533; G01R 19/16538; H01H 9/563;
(Continued)

(56) References Cited

U.S. PATENT DOCUMENTS 9,082,562 B2 * 7/2015 Kinoshita .............. H02H 9/002
9,515,479 B2 * 12/2016 Koshizuka ........... H01H 33/593
(Continued)

FOREIGN PATENT DOCUMENTS

CA    2682784 A1 * 11/2008 ............. H02H 9/002
CA    2844245 A1 *  3/2013 ............. H01H 9/563
(Continued)

OTHER PUBLICATIONS

International Search Report and Written Opinion of the International Searching Authority, PCT/IB2019/061266, dated Apr. 6, 2020, 13 pages.
(Continued)

*Primary Examiner* — Sisay G Tiku
(74) *Attorney, Agent, or Firm* — Sage Patent Group

(57) ABSTRACT

The invention relates to monitoring operation of a switching device in a power system, where a load is connected to a power source through the switching device. The load has windings, with coupling between at least one of two or more phases of a winding, and two or more windings of the load. The method includes obtaining measurements of at least one of voltages and currents, at one or more of a source and load side. Further, the method determines an electrical parameter associated with electrical switching of one or more poles. The parameter for each pole is determined based on at least one of voltage measurements at the source and load side, and line measurements associated with at least one winding. The values of the electrical parameter are monitored to determine the switching instant of the pole, for determining mechanical
(Continued)

operating time deviation for estimating future switching instants.

17 Claims, 10 Drawing Sheets

(51) Int. Cl.
    *G01R 19/165*    (2006.01)
    *G01R 15/14*    (2006.01)
    *H01H 71/12*    (2006.01)
    *H01H 7/16*    (2006.01)

(52) U.S. Cl.
    CPC ............ *H01H 7/16* (2013.01); *H01H 33/593* (2013.01); *H01H 71/125* (2013.01)

(58) Field of Classification Search
    CPC .... H01H 33/59; H01H 33/593; H01H 71/123; H01H 71/125; H01H 7/16
    See application file for complete search history.

(56) References Cited

U.S. PATENT DOCUMENTS

| | | | | |
|---|---|---|---|---|
| 2003/0189378 A1* | 10/2003 | Stanek | ...................... | H02J 3/04 307/130 |
| 2008/0019063 A1* | 1/2008 | Muller | .................... | H01H 9/56 361/42 |
| 2011/0181989 A1* | 7/2011 | Udagawa | ............... | H02H 9/002 361/35 |
| 2012/0236443 A1 | 9/2012 | Kinoshita et al. | | |
| 2014/0192443 A1 | 7/2014 | Koshizuka et al. | | |
| 2015/0124357 A1* | 5/2015 | Kawasaki | ............ | H01H 33/593 361/35 |
| 2018/0012711 A1* | 1/2018 | Talluri | ..................... | H02H 7/04 |
| 2019/0190254 A1* | 6/2019 | Parikh | ..................... | H01H 9/56 |
| 2021/0203521 A1* | 7/2021 | Konda | ................ | H04L 63/1425 |
| 2021/0394638 A1* | 12/2021 | Lepper | ................... | G01R 31/40 |

FOREIGN PATENT DOCUMENTS

| | | | | |
|---|---|---|---|---|
| CN | 106605344 B | * | 5/2019 | ............. H02H 9/002 |
| EP | 2629314 A1 | | 8/2013 | |
| EP | 2637189 A1 | * | 9/2013 | ............. H01H 33/59 |
| EP | 2665078 A1 | | 11/2013 | |
| EP | 3629437 A1 | * | 4/2020 | ............... H02H 3/06 |
| JP | 2008140580 A | * | 6/2008 | |
| JP | 2013037767 A | * | 2/2013 | |
| WO | WO-2012014282 A1 | * | 2/2012 | ........... H01H 33/593 |
| WO | WO-2012039373 A1 | * | 3/2012 | ........... H01H 33/593 |
| WO | WO-2012124474 A1 | * | 9/2012 | ........... H01H 33/593 |
| WO | WO-2013168519 A1 | * | 11/2013 | ........... H01H 33/593 |
| WO | 2018037262 A1 | | 3/2018 | |

OTHER PUBLICATIONS

Indian Examination Reported dated Jul. 9, 2020 for Indian Patent Application No. 201841049259, 5 pages.

* cited by examiner

METHOD AND DEVICE FOR MONITORING OPERATION OF A SWITCHING DEVICE FOR CONTROLLED SWITCHING APPLICATIONS

CROSS REFERENCE TO RELATED APPLICATIONS

This application is a 35 U.S.C. § 371 national stage application of PCT International Application No. PCT/IB2019/061266 filed on Dec. 23, 2019, which in turns claims foreign priority to Indian Patent Application No. 201841049259, filed on Dec. 27, 2018, the disclosures and content of which are incorporated by reference herein in their entirety.

FIELD OF THE INVENTION

The present invention relates to controlled switching applications in electrical power systems. More specifically, the present invention relates to monitoring of switching devices for controlled switching applications in such power systems.

BACKGROUND OF THE INVENTION

Application of controlled switching techniques is well known in electrical power systems. This can be for example, limiting voltage or current surges, protecting equipment etc. Switching devices such as circuit breakers, disconnectors etc. are used for performing the controlled switching functions. It is important to monitor the switching of breaker. The current techniques rely on monitoring using precision mechanical feedback, load currents and load voltages, to achieve the desired accuracy in breaker monitoring to assist controlled switching.

In case of coupled loads, the monitoring of the breaker currents is dependent on determination of mechanical or electrical switching instants. This can be for example based on monitoring of the voltage or auxiliary contacts (e.g. mechanical switching), as monitoring of the currents may not be suitable. Alternately, this can be based on the monitoring of the breaker currents (e.g. electrical switching).

It is possible to accurately detect the energizing and de-energizing of the breaker from the instants of breaker current inception and interruption. However, in case of load voltage, this monitoring can be inaccurate due to the influence of the load. The connected load can be electrically or magnetically coupled, which can alter the behavior of the load voltage. Unlike the breaker current which only shows up when the respective breaker pole is energized, the load voltage can even show up without the breaker pole being energized. This is due to the coupling between the phases of the load, or between windings of the load.

Hence, it is very difficult to detect the energization instants of the later phases to close, or the de-energization instants of the first phases to open, from load voltage alone. Under such a condition, monitoring of the load voltage and the subsequent monitoring of breaker and associated correction in operating time to assist controlled switching will be incorrect.

SUMMARY OF THE INVENTION

An aspect of the invention relates to a method for monitoring operation of a switching device in a power system. In the power system, a load is connected to a power source through the switching device. In accordance with various embodiments, the load has one or more windings. Here, the load is a coupled load. Accordingly, there can be coupling between two or more phases of a winding of the load. Alternately or additionally, there can be coupling between two or more windings of the load.

The method includes obtaining measurements of at least one of voltages and currents, from one or more measurement equipment. Here, the measurements are obtained at one or more of a source side and a load side.

The method also includes determining values of an electrical parameter associated with electrical switching of one or more poles of the switching device. The values of the electrical parameter for each pole of the one or more poles is determined based on at least one of the measurements of voltages at the source side and the load side, and line measurements associated with at least one winding of the one or more windings of the load. The line measurements can be at a primary side or a secondary side of the load. Further, the line measurements can be line to ground measurements or line to line measurements.

In accordance with an embodiment, the electrical parameter is a gap voltage. Here, the values of the gap voltage for the pole are determined based on the difference between the measurements of voltages at the source side and the load side for a phase associated with the pole.

In accordance with another embodiment, the electrical parameter is line to line voltage. Here, the values of the electrical parameter are determined based on the line measurements of voltages at the load side. The line measurements can provide the line to line voltages at the load side. Alternately, the line to line voltages are estimated based on one or more of a difference of the line measurements at the load side, and a transformation of the line measurements to obtain the line to line voltages. Here, the transformation can include one or more steps of converting the line measurements at the secondary side to the line to line voltages at the primary side. The objective of the transformation is to determine coil voltages (of the star/delta connected windings) from the obtained measurements, wherein the transformation can have one or more steps.

The method further comprises monitoring the values of the electrical parameter and determining electrical switching instant of the corresponding pole of the switching device, from the monitoring of the value of the electrical parameter. Thus, the method comprises determining the electrical switching instants for each pole.

The electrical switching instants determined from the monitoring of the electrical parameter, is used for determining mechanical operating time deviation for individual poles. The electrical switching instants, along with mechanical and dielectric properties of the switching device including, but not limited to, mechanical and dielectric scatter, are used for determining the mechanical operating time deviation.

The mechanical operating time deviation for each pole is used to evaluate release instant of an output command for operating the corresponding pole of the switching device at desired electrical switching instant.

The method may be implemented with a device of the power system, which has the measurements obtained with the one or more measurement equipment. In accordance with an embodiment, the device is a relay. Also, the measurement equipment can be potential transformers, and the relay receives voltage measurements from the potential transformers.

In accordance with an aspect, the device comprises an input interface, a calculator, a monitor and an output interface, which perform one or more steps, or parts thereof, of the method. The device can be used for monitoring the switching device, where the load is a coupled load.

The load can be inductive, capacitive, and/or resistive or combination of thereof, with different design and/or connection configuration. In accordance with an embodiment, the load is a capacitor and the electrical parameter is a gap voltage. In accordance with another embodiment, the load is a transformer and the electrical parameter is a line to line voltage of at one of a star side and a delta side of the transformer.

BRIEF DESCRIPTION OF DRAWINGS

The subject matter of the invention will be explained in more detail in the following text with reference to exemplary embodiments which are illustrated in attached drawings in which.

DETAILED DESCRIPTION

The invention relates to power systems such as power transmission or distribution systems, where there are switching devices involved in power system applications such as controlled switching. As is generally known, controlled switching is used to eliminate or minimize harmful electrical transients, by performing a planned switching of loads such as capacitors, reactors, power transformers or other power system equipment having combined capacitive & inductive properties. In such applications, switching devices such as circuit breakers, are typically used for connecting the power supply with the load. A controller, relay or Intelligent Electronic Device (IED) can be used for controlling the operation of the circuit breaker and switching of the load.

In controlled switching application of switching devices such as breakers, monitoring functionality is quite important to implement subsequent adaptations and corrections in the switching. For example, the closing for each pole may be monitored, in order to control the opening or closing of the pole at the point on wave in subsequent instants, for optimal switching of the load.

The monitoring functionality basically depends on the mechanical and/or electrical feedbacks from either the breaker or the loads. For example, there can be measurement equipment such as current or voltage transformers at suitable locations, for measuring breaker currents or load voltages. Typically, the breaker currents and the load voltages are monitored for the controlled switching. In case of loads such as transformers, capacitors, reactors or equipment having combined inductive and capacitive properties, the load voltage may be that of a secondary or a tertiary winding having delta connection. On other side, the coupling can also be present due to magnetic circuit of the transformer or reactors. Accordingly, there can be coupling between different phases of a winding, or between different windings. This leads to difficulty in accurately identifying the energization or de-energization (or switching) instants of the subsequent phases, thereby affecting the subsequent operation for controlled switching.

The present invention provides for accurate determination of the switching instants of different phases, after energization or de-energization of any one of the different phases a load is connected in. The present invention will be described taking a power system (100) shown in FIG. 1 as an example.

Figure 1:
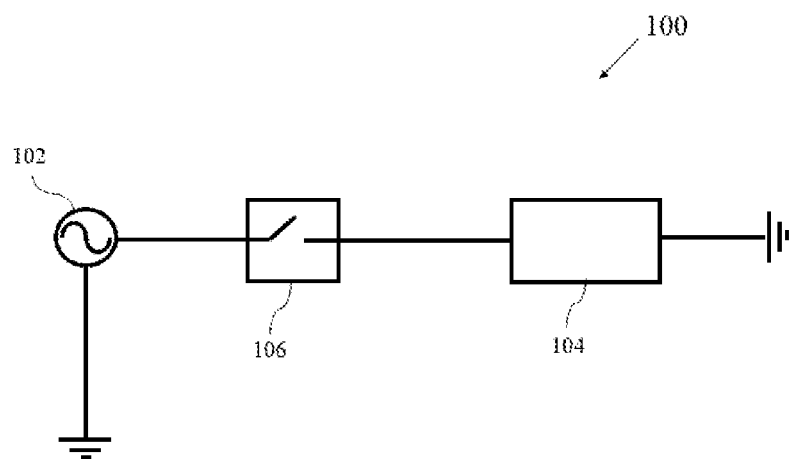
FIG. 1 shows a single line diagram of a power system, in accordance with various embodiments of the present invention.

The power system shown in FIG. 1, includes a power source (102), for providing power to a load (104). The power source is used for energization or charging of the load. The power source can be a three-phase alternating source, and the load is a coupled load. Here, the load can be magnetically and/or electrically coupled. For example, the load can be inductive, capacitive, resistive or a combination of thereof, with different design and/or connection configuration. For example, the power source can be an AC grid, while the load can include capacitor banks, shunt reactors, power transformers, three-limbed reactors, or a combination thereof as an example a cable connected to a transformer.

The power source is connected to the load through a switching device (106). The switching device can be a breaker, a disconnector or a combination thereof, like disconnecting circuit breakers or other similar switching device based on power electronics technology.

The switching device has one or more poles, each of which are operated (i.e. connected or disconnected) for energizing or de-energizing a corresponding phase in which the load is connected.

Figure 2:
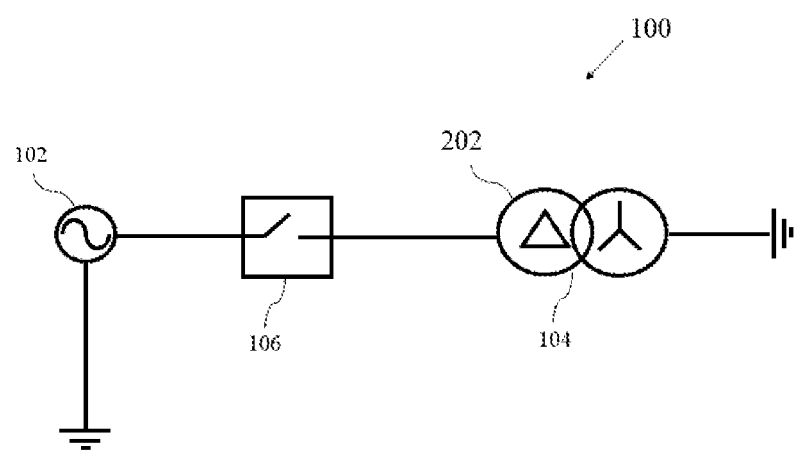
FIG. 2 shows a single line diagram of a power system, in accordance with an embodiment of the present invention.
Figure 6:
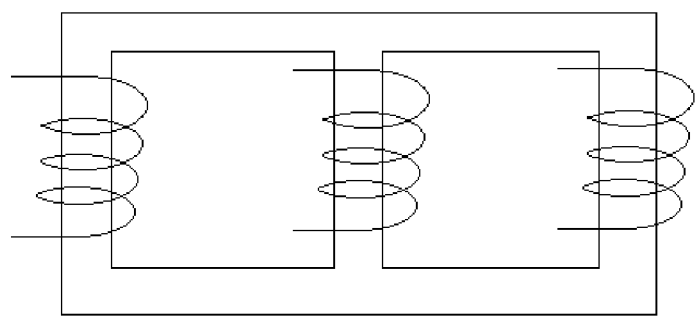
FIG. 6 shows a three limbed magnetically coupled reactor.

In accordance with different embodiments, the load is a coupled load. In order words, the load has one or more windings, and there is coupling between different phases on a winding. Additionally, or alternately, there is coupling between different windings. Consider the example shown in FIG. 2 or 3, where the load is a power transformer. In these examples, the power transformer has a star-delta or a delta-star connection. Accordingly, there can be coupling between the windings or phases. For example, when the load is connected at the delta side (e.g. 202), there is coupling between the windings on primary side. Taking another example, when the load is connected at the star side (e.g. 302), there is coupling between phases on secondary side through delta connection. In another example, the load 104 can be a three-limb reactor, there is coupling due to magnetic circuit as shown in FIG. 6.

Measurements of voltages and/or currents can be performed at the source side and/or the load side. The measurements are performed with measurement equipment provided for performing measurements at different line locations. For example, the measurement equipment can include a current transformer, a potential transformer, a sensor-based measurement equipment (e.g. Rogowski coils, non-conventional instrument transformers etc.) and/or the like, which provides a signal corresponding to voltage or current, as sensed from the line. For example, a voltage transformer provides single/multiple phase voltage signal. The line measurements at the load side can be at the primary side or the secondary side. Also, the line measurements can be line to line measurements or line to ground measurements.

Figure 4:
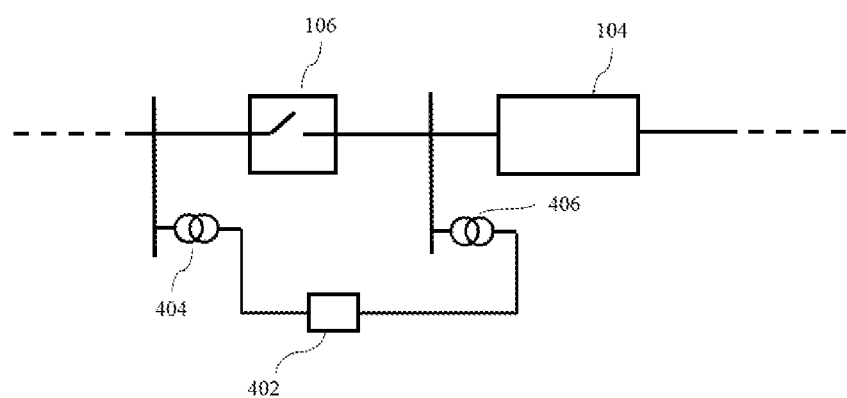
FIG. 4 shows measurement of source and load voltages, in accordance with an embodiment of the invention.
Figure 5:
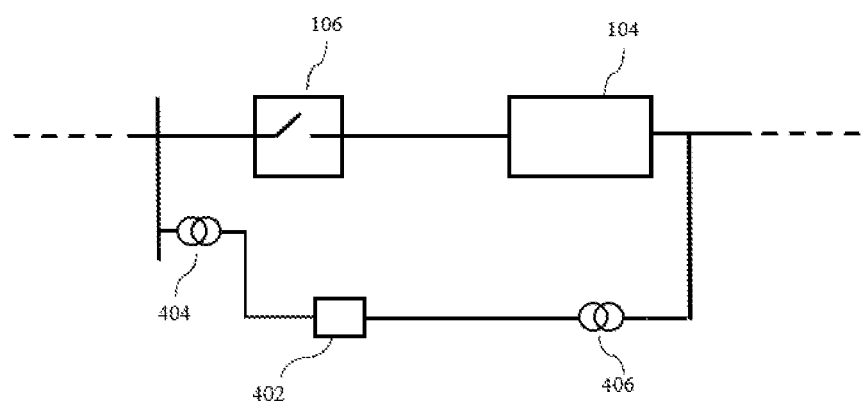
FIG. 5 shows measurement of source and load voltages, in accordance with another embodiment of the invention.

Consider the embodiments shown in FIGS. 4 and 5, where there are two potential transformers (404, 406). A potential transformer (e.g. first (404)) measures voltages at the source side, while the other potential transformer (e.g. second (406)) measures voltages at the load side. Here the load side measurements can be at the primary (see FIG. 4) or secondary side (FIG. 5). It should be noted that a measurement equipment may be provided for each line/phase for performing measurements associated with the corresponding line/phase. Accordingly, there would be three potential transformers for the three lines providing the power at the load side. Also, it should be noted that even though only voltage transformers are shown in FIGS. 4 and 5, current transformers (or other suitable equipment) can be used as an alternative to voltage transformers or in addition to voltage transformers, for having either current measurements or both voltage and current measurements. The position of the load side voltage measurement can also be on any winding for a multi-winding load. As an example, for a two-winding transformer, the load side voltage measuring device 406 can be placed on primary or secondary winding as shown in FIGS. 4 and 5.

The measurements obtained with the measurement equipment are provided to a device (402). For example, a relay or an intelligent electronic device (IED) receives a signal(s) from the measurement equipment, and obtain measurements therefrom. Alternately, the measurement equipment publishes the measurements over a bus (e.g. process bus), and the IED (e.g. subscribed to receive data from such bus) receives the measurements. It is to be noted that the relay may internally process the measurements obtained with the measurement equipment, or the measurements may be processed before being provided to the relay. For instance, there may be power electronic circuitry or dedicated measurement units for having the line measurements.

Figure 7:
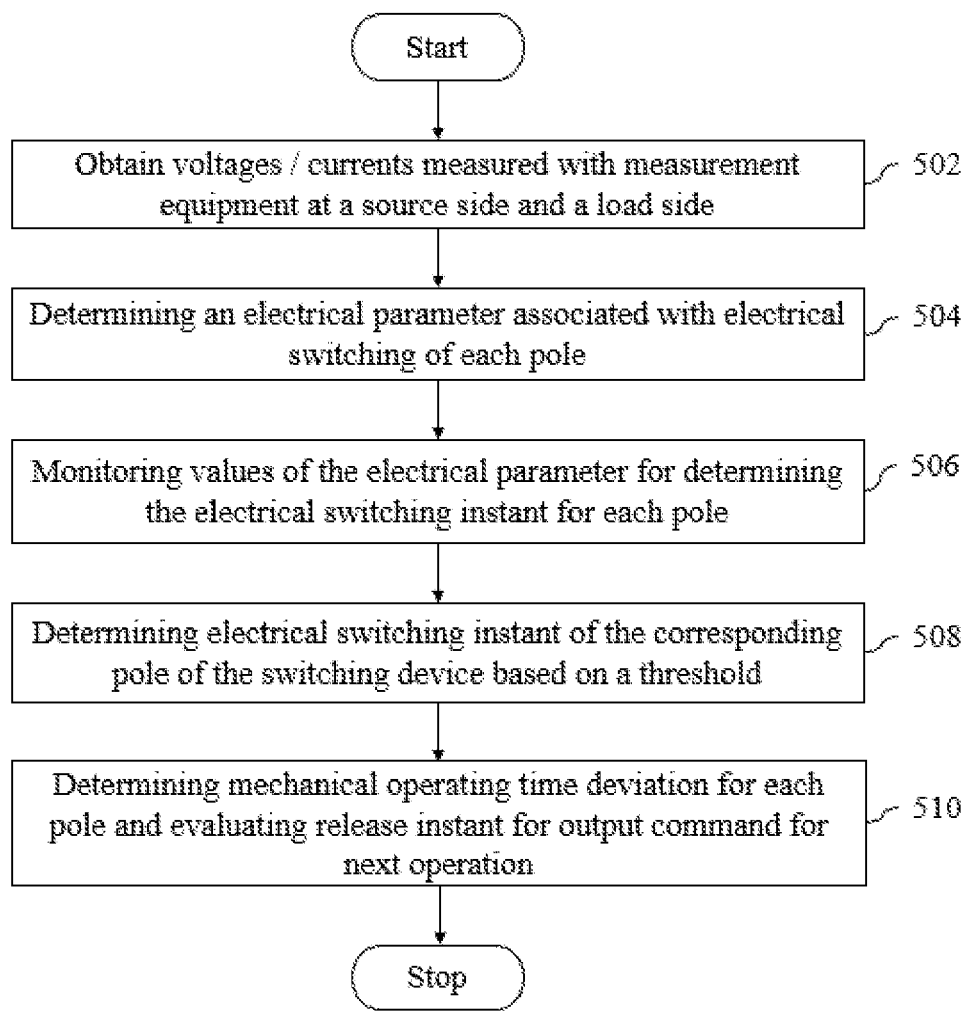
FIG. 7 is a flowchart of a method for monitoring operation of a switching device, in accordance with an embodiment of the invention.

The monitoring of operation of the switching device such as 106, can be performed using a device such as 402, which has the source side and load side measurements. Moving now to FIG. 7, which is a flowchart of a method for monitoring the operation of the switching device, in accordance with an embodiment of the invention.

At 502, measurements of at least one of voltages and currents, are obtained from one or more measurement equipment. Here, the measurements are obtained at one or more of a source side and a load side. In the embodiments of FIGS. 4 and 5, voltage measurements at the source side and the load side are obtained from the potential transformers (404, 406). In another embodiment (not shown), the voltage measurements at only the load side are obtained. The load side measurements can be line to line measurements or line to ground measurements.

At 504, the values of the electrical parameter for each pole of the one or more poles are determined. The values of the electrical parameter are determined based on at least one of the measurements of voltages at the source side and the load side, and line measurements associated with at least one winding of the one or more windings.

In accordance with an embodiment, the electrical parameter is a gap voltage. Here, the values of the gap voltage for each pole is determined. The values for a pole are determined based on the difference between the measurements of voltages at the source side and the load side for the corresponding pole. Thus, for a phase associated with the pole, the difference between the source and load side voltages are taken as the gap voltage values. Mathematically, it can be expressed as:

Gap voltage=Source voltage−Load voltage.

Prior to evaluation of the gap voltage, load voltage for individual poles can also be internally post processed like added or subtracted to get correct electrical parameter estimation. This can also include a transformation of the line measurements to obtain the line to line voltages. The transformation can include one or more steps of converting the line measurements at the secondary side to the line to line voltages at the primary side. The objective of the transformation is to determine coil voltages (of the star/delta connected windings) from the obtained measurements, wherein the transformation can have one or more steps.

In accordance with another embodiment, the electrical parameter is a line to line voltage. Here, the values of the electrical parameter is determined based on the line measurements of voltages at the load side. Alternately, the electrical parameter can be derived from winding voltages (coil voltages) which are obtained from the line measurements. Consider the embodiment shown in FIG. 2. Here, the load (i.e. power transformer) is connected at the delta side. Thus, the potential transformers already provide a line to line voltages.

Figure 8:
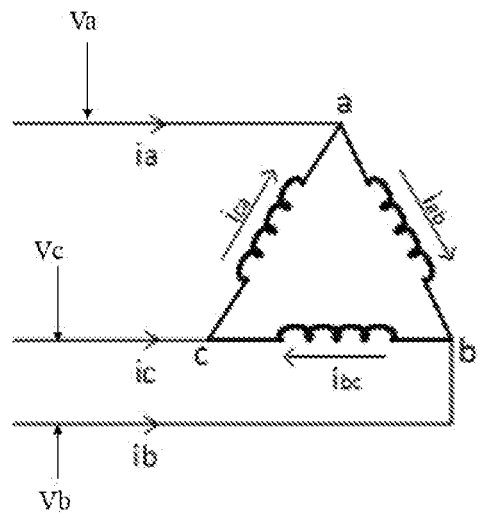
FIG. 8 shows measurements at a delta side of a transformer, in accordance with an embodiment of the invention.
Figure 9:
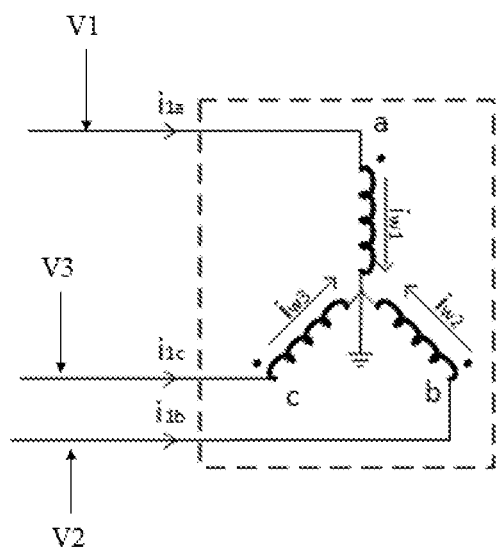
FIG. 9 shows measurements at a star side of a transformer, in accordance with an embodiment of the invention.

Consider the embodiment shown in FIG. 8. Here, Va can be seen as a difference between V1 and V2 of the star side (refer FIG. 9), Vb can be seen as a difference between V2 and V3, and Vc can be seen as a difference between V3 and V1. Thus, when the measurement is performed at a line/phase (line measurements) for the delta side line, the measurement provides the line to line voltage.

Figure 3:
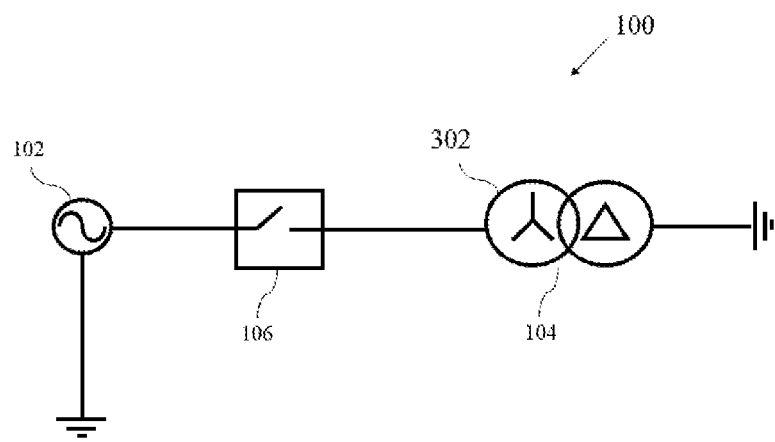
FIG. 3 shows a single line diagram of a power system, in accordance with another embodiment of the present invention.

In case the measurements are performed at the star side, such as for embodiment shown in FIG. 3, the line measurements provide individual line/phase values. These can be line to ground or line to line depending on whether the winding is star grounded or star ungrounded. Accordingly, a difference between two line measurements is required (e.g. V1−V2, V2−V3, V3−V1) to arrive at the line to line voltages for the load.

At 506, the values of the electrical parameter associated with electrical switching of one or more poles are monitored. This can be a continuous monitoring to detect when the values for a particular pole are around a desired value (e.g. less than a threshold).

Such thresholds can be determined beforehand based on noise due to external or internal parameters and used to determine switching instants. For example, the instant when gap voltage becomes zero (or close to zero) can be interpreted as the pole being electrically open. Taking another example, the instant when the line to line voltage crosses certain value (close to zero) can be interpreted as the pole being electrically closed.

At 508, the electrical switching instant of the corresponding pole of the switching device, is determined from the monitoring of the value of the electrical parameter. Thus, for example, when the values for the electrical parameter becomes less than or more than the threshold, the instant of switching is detected.

The electrical switching instants determined from the monitoring of the electrical parameter, is used for determining mechanical operating time deviation for individual poles at 510. The electrical switching instants, along with mechanical and dielectric properties of the switching device including, but not limited to, mechanical and dielectric scatter, are used for determining the mechanical operating time deviation. The determination of mechanical operating times based on electrical switching instants is generally known, and therefore not described in further detail herein.

The mechanical operating time deviation for each pole is used to evaluate release instant of an output command for operating the corresponding pole of the switching device at desired electrical switching instant. Thus, based on the mechanical operating time deviations, relay or other devices can evaluate release instant for outputting command for breaker pole switching.

The instants of output command during open and/or close operation for different poles, can be provided as output. For example, the switching instants/deviation can be provided on a display or used in a subsequent switching. Thus, optionally, the method can also be utilized for the electrical switching instant information for subsequent switching operations.

The method may be implemented with a device of the power system such as 402, which has the measurements obtained with the one or more measurement equipment. In accordance with an embodiment, the device is a relay. Also, the measurement equipment can be current and/or potential transformers, and the relay receives current and/or voltage measurements from the current and/or potential transformers.

In accordance with an embodiment, the device comprises a plurality of components for performing the method or steps thereof. The components or modules of the device can be implemented with a processor. For example, the device can have I/O ports which can be configured to receive voltage signal and the calculator can process the signals to determine the values for the electrical parameter.

Figure 10:
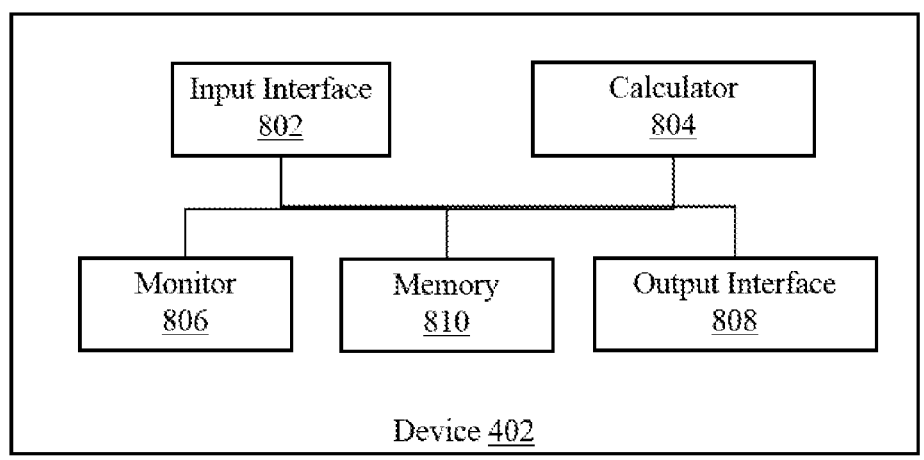
FIG. 10 is a simplified diagram of a device for monitoring operation of a switching device, in accordance with an embodiment of the invention.

In the embodiment shown in FIG. 10, the device comprises an input interface (802), a calculator (804), a monitor (806) and an output interface (808). The input interface is configured to obtain the measurements from the measurement equipment. The calculator is configured to determine the values for the electrical parameter. The monitor is configured to monitor the values to determine the switching instants and thereby, determine output command instants for the switching device during open and/or close operation. The output interface is configured to provide the values as output for example output commands to the switching device or to provide the information on a display or utilize the information for subsequent switching. The optional memory (810) can store the required information of previous operations and the information needed for performing the different steps. For example, the memory can store thresholds or information of switching instants etc.

Thus, in accordance with some embodiments, the invention relies on the concept of the electrical switches, that whenever there is a current flowing through the switch, the voltage across the switch contacts is minimum given that the resistance of the contacts is very low. The same concept is extended for switching devices, in which each pole has a minimum resistance during conduction (including electrical arcing) and practically infinite resistance during open condition. In some embodiments, where only load voltage measurements are used, line to line voltages will be minimum during open or close conditions.

The difference of the measured source voltage and load voltage gives the voltage across the breaker contacts or gap voltage. The gap voltage is a reverse mirror reflection of breaker current. Accordingly, whenever the breaker current is not present, the gap voltage is high and vice versa. Further, whenever the gap voltage dies out but either of source voltage or load voltage is still present, it can be inferred as the breaker is conducting and vice-versa.

In case of determining the switching instants from the load voltage measurements, due to interphase/interwinding coupling, the load voltages of the poles not operated will become non-zero during switch on and will become zero during switch off operation performed on one or more other poles. By employing the method disclosed herein, the load voltages can be further processed so as the individual phase voltage becomes non-zero during switching on operation performed only for the respective pole and will become zero during switch off operation performed only on the respective pole. Thus, the interphase/interwinding coupling affect can be eliminated by monitoring the switching on or switching off based on the load voltages.

The following description provides results of implementation of the method for different load and its configurations.

Figure 11:
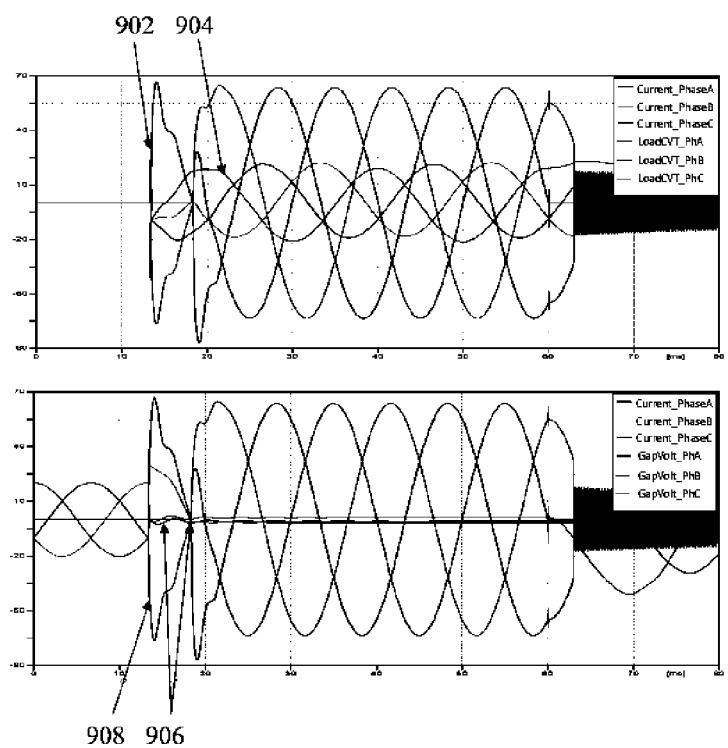
FIGS. 11-15 show various graphical results related with implementation of the method.

Capacitor Star Ungrounded or Delta Connected (Electrically Coupled):

When a star ungrounded or delta connected capacitor is taken as an example, the load voltages (such as 904) and breaker currents (such as 902) are shown in the upper graph of FIG. 11. The lower graph of FIG. 11 depicts the gap voltages (such as 906) and the breaker currents (such as 908). As can be seen, the breaker currents exactly define the instants of energization and de-energization of the breaker. Whereas the load voltage does not depict the accurate instant of energization and de-energization of the load. Instead the gap voltages (see 906) can be used to depict the exact instant as that of current. As seen from FIG. 11, as the current starts flowing the gap voltage goes to zero or a minimum value and as soon as current goes to zero, a significant amount of gap voltage is seen across the breaker contacts.

Inductor Star Ungrounded or Delta (Electrically Coupled)

Figure 12:
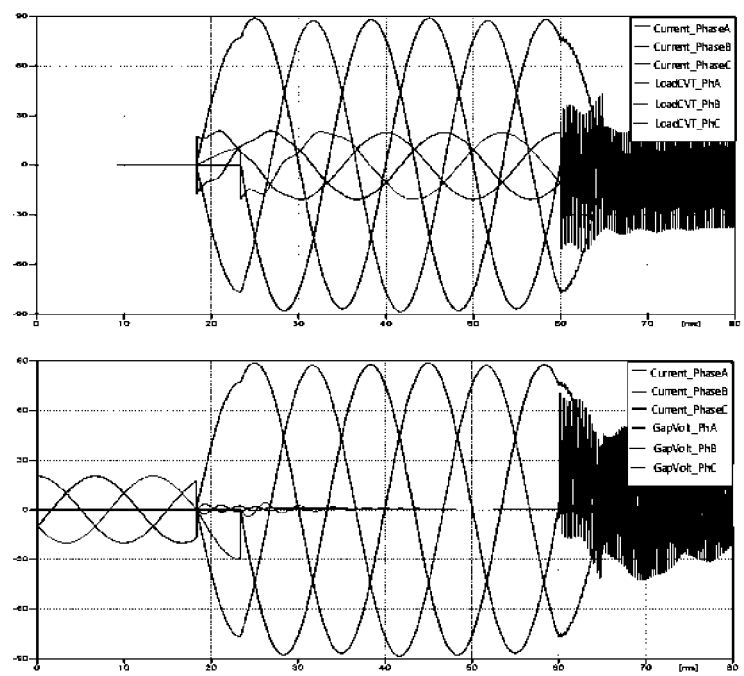

The characteristics for an inductor that is star ungrounded, or has a delta configuration, the behavior is similar to that of capacitor as coupled load as shown in FIG. 12. Reactors as coupled loads also display a similar behavior in terms of gap voltage as shown in FIG. 12.

Three-Limb Inductor (Magnetically Coupled)

Figure 13:
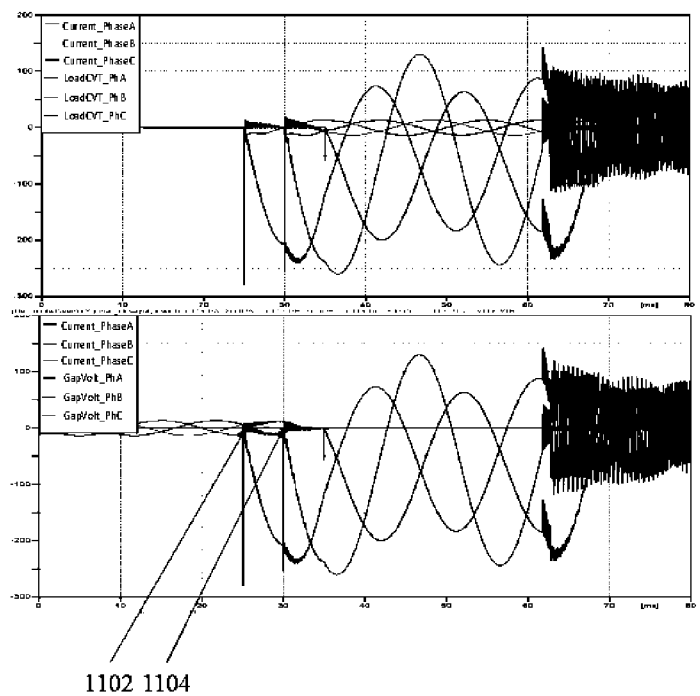

The usage of gap voltages for determining the electrical switching instants holds strong even in case of three limbed-core inductor. Even though the current in one phase induces voltage in other phases, as seen in the load voltage waveforms of FIG. 13, gap voltage waveforms depict the actual instant (see 1102, 1104) when the current starts flowing through each phase of the breaker.

Transformer

In case of transformer, the voltages at the secondary or tertiary windings can be transformed to the coil voltages by knowing the connection of the coil and the connected measurement equipment (e.g. (C)VT). For example, if a delta connected winding is receiving the measured voltage from a star VT, the coil voltage can be deduced by subtracting the phase voltages. By multiplying the turns ratio to the coil voltage, the primary coil voltage can be evaluated. After evaluation of primary voltages (or load voltage), the gap voltage can be derived as per:

Gap voltage=Source voltage−Load voltage

Figure 14:
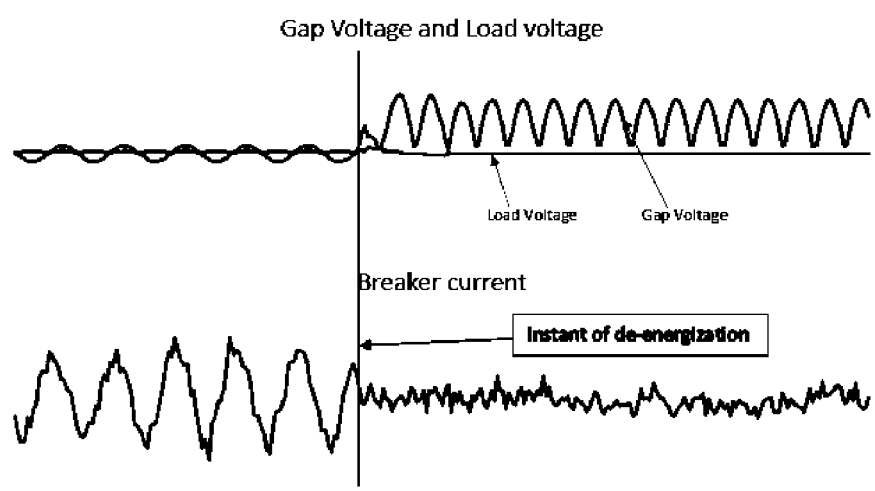

This gap voltage can be used like any other loads to monitor the energization and de-energization instants as shown in FIG. 14.

After the gap voltages have been evaluated, a threshold can be implemented to detect the inception and interruption of gap voltages. The threshold value can be used on the magnitude of the gap voltages or on the slope of the gap voltages to exact detect the instant of energization and de-energization by compensating individual pole-wise external noise upon adjusting individual pole-wise thresholds.

The above examples relate to usage of gap voltage as the electrical parameter for determining the electrical switching instants. The following description provides results of implementation of using voltage transfer or line to line voltages for determining the electrical switching instants.

This methodology can be considered for coupled reactors or transformers. As discussed above, in coupled loads, switching of individual phases impacts the load voltage measurements in other phases. By proper manifestation of the load voltage, the coupling effect can be eliminated.

Figure 15:
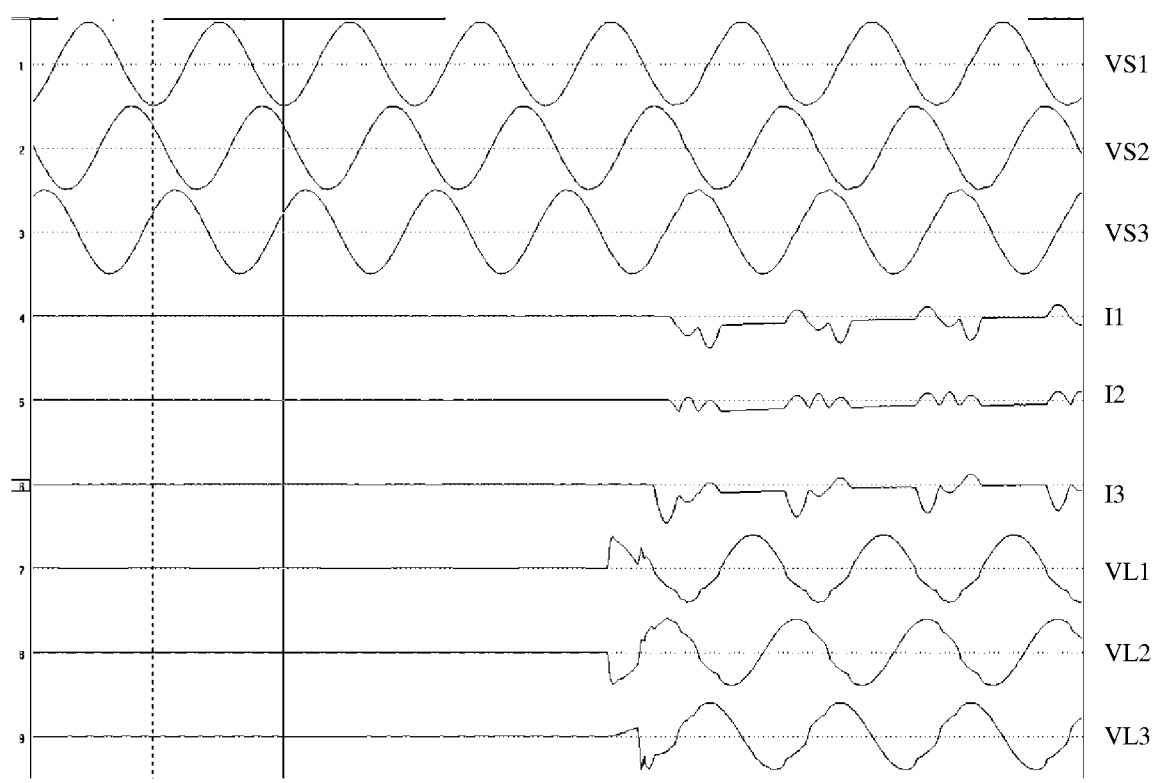

To illustrate the effect, an example of a three-limbed transformer switching is provided. As shown in FIG. 15, the topmost waveforms (see VS1, VS2, VS3) shows the source voltage of transformer in a three-limbed transformer. With the inception of load voltage in R phase, there is an opposite and half voltage in the other two phases. This is due to coupling effect of phase windings. But the coupling effect can be eliminated by converting this voltage to line-to-line voltage. As shown in the waveforms on the bottom of FIG. 15 (see VL1, and VL3), by deriving the line-to-line voltage, the instant of energization can be significantly detected. An individual pole-wise threshold-based detection can be applied onto the line-to-line voltage for compensating external or internal noise of the embodiment; thereby evaluation of correct instant of energization or de-energization of individual poles of the switching device.

Thus, the present invention makes use of load voltages, along with source voltages, as an appropriate signal for monitoring of a switching device such as a breaker. The evaluated outputs of this invention can be used for various controlled switching applications. Examples of these applications include, but are not limited to, evaluating the individual pole-wise mechanical operating time deviation, output command release and electrical operating instants of the breaker, determining status of the breaker, adaptation of the breaker for very next switching operation in subsequent instants and so forth.

We claim:

1. A method for monitoring operation of a switching device in a power system, the switching device comprising a plurality of poles connecting a coupled load to a power source, the method comprising:
    obtaining, by a device, a measurement of a voltage at a source side from a measurement equipment connected to the device, and a measurement of a voltage at a load side from a second measurement equipment connected to the device, the coupled load comprising a plurality of windings, and a coupling between one of at least two phases of a winding of the plurality of windings and at least two windings of the plurality of windings;
    determining at least one of:
        a gap voltage associated with electrical switching of at least one pole of a plurality of poles of the switching device based on the measurement of the voltage at the source side and the measurement of the voltage at the load side, and
        a line to line voltage of the at least one pole of the plurality of poles of the switching device based on a line measurement associated with at least one winding of the plurality of windings of the coupled load;
    monitoring whether the gap voltage for the at least one pole meets a gap voltage threshold and whether the line to line voltage for the at least one pole meets a line to line voltage threshold during operation of another pole of the plurality of poles of the switching device;
    determining an electrical switching instant for the at least one pole based on at least one of the gap voltage for the at least one pole meeting the gap voltage threshold and the line to line voltage for the at least one pole meeting the line to line voltage threshold during operation of another pole of the plurality of poles of the switching device; and
    determining a mechanical operating time deviation for the at least one pole based on the electrical switching instant, for evaluating release instant of an output command of the switching device for operating the at least one pole of the switching device at the electrical switching instant.

2. The method of claim 1, wherein the gap voltage for the at least one pole is determined based on a difference between the measurement of the voltage at the source side for a phase associated with the at least one pole and the measurement of the voltage at the load side for a phase associated with the at least one pole.

3. The method of claim 1, wherein the line to line voltage is determined based on a line measurement of the voltage at the load side.

4. The method of claim 3, wherein the line measurement provides at least one of the line to line voltage and line to ground voltage at the load side,
    wherein the line measurement at the load side is at one of a primary side and a secondary side of the coupled load, and
    wherein at least one of the primary side and the secondary side comprises at least one of a star ungrounded and a delta connected winding.

5. The method of claim 4, wherein the line to line voltages are estimated based on at least one of a difference of the line measurements at the load side, and a transformation of the line measurements, wherein the transformation of the line measurements is used to determine winding voltages.

6. The method of claim 1, wherein determining the electrical switching instant for the at least one pole based on the gap voltage for the at least one pole meeting the gap voltage threshold further comprises determining the electrical switching instant based on a determination that the gap voltage is zero and at least one of the source voltage and the load voltage is non zero during operation of the another pole of the plurality of poles.

7. The method of claim 1, wherein determining the electrical switching instant for the at least one pole based on the line to line voltage for the at least one pole meeting the line to line voltage threshold further comprises at least one of determining that the load voltage becomes non zero during a switch on operation of another pole of the plurality of poles and determining that the load voltage becomes zero during a switch off operation of another pole of the plurality of poles.

8. A device for monitoring operation of a switching device in a power system, the device comprising:
    an input interface for obtaining a measurement of a voltage at a source side from a first measurement equipment connected to the device and a measurement of a voltage at a load side of a coupled load from a second measurement equipment connected to the device, wherein the coupled load comprises a plurality of windings, and a coupling between one of at least two phases of a winding of the plurality of windings and at least two windings of the plurality of windings;

a calculator configured to determine:
    a gap voltage associated with an electrical switching of at least one or a plurality of poles of the switching device based on the measurement of the voltage at the source side and the measurement of the voltage at the load side;

a monitor configured to:
    monitor whether the gap voltage for the at least one pole meets a gap voltage threshold based on whether the gap voltage is zero and at least one of the source voltage and the load voltage is non zero during operation of another pole of the plurality of poles of the switching device,
    determine an electrical switching instant for the at least one pole when the gap voltage for the at least one pole meets the threshold during operation of another pole of the plurality of poles of the switching device, and
    determine a mechanical operating time deviation for the at least one pole based on the electrical switching instant, wherein the mechanical operating time deviation is used for evaluating release instant of an output command for operating the at least one pole of the switching device at desired electrical switching instant; and an output interface for providing an output command to the switching device, the output command configured to operate the at least one pole of the switching device.

9. The device of claim 8, wherein the device is a relay, and wherein each measurement equipment is a potential transformer, and wherein the relay receives voltage measurements from the potential transformers.

10. The device of claim 8, wherein the device is a relay,
    wherein obtaining the measurement of the voltage at the source side comprises the relay receiving the measurement of the voltage from the first measurement equipment, and
    wherein obtaining the measurement of the voltage at the load side comprises the relay receiving the measurement of the voltage from the second measurement equipment.

11. The device of claim 10, wherein the first measurement equipment comprises a first potential transformer configured to provide the measurement of the voltage at the source side to the relay, and
    wherein the second measurement equipment comprises a second potential transformer configured to provide the measurement of the voltage at the load side to the relay.

12. A method for monitoring operation of a switching device in a power system, the switching device comprising a plurality of poles connecting a coupled load to a power source, the method comprising:
    obtaining, by a device, a measurement of a voltage at a source side from a first measurement equipment connected to the device, and a measurement of a voltage at a load side from a second measurement equipment connected to the device, the coupled load comprising a plurality of windings, and a coupling between one of at least two phases of a winding of the plurality of windings and at least two windings of the plurality of windings;
    determining a line to line voltage of at least one pole of the plurality of poles of the switching device based on a line measurement associated with at least one winding of the plurality of windings of the coupled load;
    monitoring whether the line to line voltage for the at least one pole meets a line to line voltage threshold based on at least one of determining that the load voltage becomes non zero during a switch on operation of another pole of the plurality of poles and determining that the load voltage becomes zero during a switch off operation of another pole of the plurality of poles during operation of another pole of the plurality of poles of the switching device;
    determining an electrical switching instant for the at least one pole based on the line to line voltage for the at least one pole meeting the line to line voltage threshold during operation of another pole of the plurality of poles of the switching device; and
    determining a mechanical operating time deviation for the at least one pole based on the electrical switching instant, for evaluating release instant of an output command of the switching device for operating the at least one pole of the switching device at the electrical switching instant.

13. The method of claim 12, wherein the line to line voltage is determined based on a line measurement of the voltage at the load side.

14. The method of claim 13, wherein the line measurement provides at least one of the line to line voltage and line to ground voltage at the load side,
    wherein the line measurement at the load side is at one of a primary side and a secondary side of the coupled load, and
    wherein at least one of the primary side and the secondary side comprises at least one of a star ungrounded and a delta connected winding.

15. The method of claim 14, wherein the line to line voltages are estimated based on at least one of a difference of the line measurements at the load side, and a transformation of the line measurements, wherein the transformation of the line measurements is used to determine winding voltages.

16. The method of claim 12, wherein the device is a relay,
    wherein obtaining the measurement of the voltage at the source side comprises the relay receiving the measurement of the voltage from the first measurement equipment, and
    wherein obtaining the measurement of the voltage at the load side comprises the relay receiving the measurement of the voltage from the second measurement equipment.

17. The method of claim 16, wherein the first measurement equipment comprises a first potential transformer configured to provide the measurement of the voltage at the source side to the relay, and
    wherein the second measurement equipment comprises a second potential transformer configured to provide the measurement of the voltage at the load side to the relay.

* * * * *